United States Patent
Outwater

(10) Patent No.: US 7,682,452 B2
(45) Date of Patent: Mar. 23, 2010

(54) APPARATUS AND METHODS OF GROWING VOID-FREE CRYSTALLINE CERAMIC PRODUCTS

(75) Inventor: John O. Outwater, Cambridge, MA (US)

(73) Assignee: Sapphire Systems Inc., Cambridge, MA (US)

( * ) Notice: Subject to any disclaimer, the term of this patent is extended or adjusted under 35 U.S.C. 154(b) by 146 days.

(21) Appl. No.: 11/783,358

(22) Filed: Apr. 9, 2007

(65) Prior Publication Data
US 2008/0245292 A1 Oct. 9, 2008

(51) Int. Cl.
C30B 15/34 (2006.01)
(52) U.S. Cl. .................... 117/209; 117/16; 117/23; 117/25
(58) Field of Classification Search .................. 117/16, 117/23, 25, 209
See application file for complete search history.

(56) References Cited

U.S. PATENT DOCUMENTS

| 3,077,380 A | | 2/1963 | Wainer et al. ............... 23/142 |
| 3,471,265 A | | 10/1969 | Clapetta et al. ............. 23/288 |
| 3,471,266 A | | 10/1969 | LaBelle, Jr. et al. .......... 23/301 |
| 3,944,640 A | | 3/1976 | Haggerty et al. ............. 264/25 |
| 4,012,213 A | | 3/1977 | Haggerty et al. ............. 65/13 |
| 4,248,645 A | * | 2/1981 | Jewett ........................... 117/3 |
| 4,269,652 A | * | 5/1981 | Yancey ......................... 117/26 |
| 5,381,229 A | | 1/1995 | Murphy et al. ............. 356/345 |
| 5,458,083 A | * | 10/1995 | Fukuda et al. ............... 117/16 |
| 5,607,506 A | | 3/1997 | Phomsakha et al. ......... 117/33 |

OTHER PUBLICATIONS

LaBelle, Jr., "EFG, The Invention and Application to Sapphire Growth", Journal of Crystal Growth, 50:8-17 (1980).
LaBelle, Jr. et al., "Growth of Controlled Profile Crystals from the Melt: Part I—Sapphire Filaments", Mat. Res. Bull., 6:571-580 (1971).
LaBelle, Jr., "Growth of Controlled Profile Crystals from the Melt: Part II—Edge-Defined, Film-Fed Growth (EFG)", Mat. Res. Bull., 6:581-590 (1971).
Chalmers et al., "Growth of Controlled Profile Crystals from the Melt: Part III—Theory", Mat. Res. Bull., 6:681-690 (1971).
Pollock, "Filamentary sapphire Part 1 Growth and Microstructural Characterisation", Journal of Materials Science, 7:631-648 (1972).
Pollock, "Filamentary sapphire Part 3 The growth of void-free sapphire filament at rates up to 3.0 cm/min", Journal of Materials Science, 7:787-792 (1972).

* cited by examiner

Primary Examiner—Robert M Kunemund
(74) Attorney, Agent, or Firm—Morgan Lewis & Bockius LLP

(57) ABSTRACT

A method and apparatus for eliminating voids and improving crystal quality in shaped ceramic product, e.g. sapphire fiber or silicon sheet, from a melt by using a sloped die tip. The sloped die tip or array thereof comprises an outer sidewall which is sloped outwardly at an angle of 5° to 40° from the vertical.

6 Claims, 5 Drawing Sheets

APPARATUS AND METHODS OF GROWING VOID-FREE CRYSTALLINE CERAMIC PRODUCTS

BACKGROUND OF THE INVENTION

1. Field of the Invention

This invention relates generally to improved methods and apparatus for growing crystalline ceramic products. The invention is particularly useful for the production of fibers and rods although the invention may also be used to prepare ceramic products with other shapes such sheets and tubes. More specifically, the invention is concerned with the provision of improved methods and apparatus for rapidly growing void-free shaped sapphire products, preferably fibers and rods, by so-called Edge-defined, Film-fed Growth. In addition to enabling the production of void-free ceramic products, the invention provides improvements in the as-grown crystal quality of ceramic (e.g. sapphire and silicon) in the form of sheets, rods and tubes.

2. Description of Related Art

Crystalline materials such as sapphire have many applications that require a highly pure material that is uniform throughout, including freedom from voids. For example, a major use of sapphire fibers is for transmitting light. Good optical transmission requires void-free fibers.

Various methods have been developed to prepare crystalline ceramic fibers. One common way to prepare such crystalline products is the Edge-defined, Film-fed Growth method (EFG), a high temperature melt-solidification process which is also known as Stepanov crystal growth.

EFG is a well-known technique disclosed in numerous U.S. Patents such as U.S. Pat. No. 3,471,265 to Bailey and U.S. Pat. No. 3,591,348 to LaBelle, the contents of which are incorporated herein by reference. EFG is also described in a number of non-patent publications. See, for example, LaBelle, R E., Mlaysky, A. I., *Growth of controlled profile crystals form the melt: Part 1—Sapphire filaments*, Mat. Res. Bull. 6: 571-580 (1971); LaBelle, H. E., *EFG, the invention and application to sapphire growth*, J. Crystal Growth 50: 8-17 (1980). The process is also described in detail in other references (see e.g. *Sapphire & Other Corundum Crystals*, E. Dobrovinskaya, L. Lytvynov, and V. Pishchik, Folio Institute for Single Crystals, Ukraine 2002).

Broadly described, a typical EFG apparatus as used to make sapphire fibers comprises a crucible provided with suitable means for heating crystalline material, e.g. α-alumina, within the crucible so as to form a melt, with means for feeding the melt upwardly to a surface where the melt is pulled away, as it solidifies, to form fibers. Typically the means for feeding the melt to the pulling area comprises a centrally bored rod, referred to herein as a die, which is positioned within the crucible and extends vertically from near the base of the crucible upwardly through the height of the crucible so that its upper end terminates just above the top of the crucible. The die includes a narrow bore which runs axially the length of the die so as to provide a central opening at the top end of the die surrounded by a flat lateral surface. The lower end of the die is open to the interior of the crucible to receive molten material therefrom. In operation, molten material in the crucible enters at the lower end of the bore, rises through the bore by capillary action and exits from the open top end of the bore where it forms a pool or film of molten material over the flat top end of the die. Positioned directly above this pool or film is a seed material which can be moved vertically up or down. Initially the seed is moved downwardly to contact the melt on the top surface of the die and it is then gradually moved upwardly drawing the solidifying melt with it to form fiber or rod of the desired diameter.

In the conventional EFG system as used to make fibers, the sidewall of the portion of the die which extends above the crucible and underlies the flat horizontal top surface that holds the melt, is at right angles to the flat top surface. Thus, in essence, the die for fiber production, generally comprises an axially bored right cylinder which is open at the top to permit melt to flow out of the bore onto the top end of the die where it is drawn away as it solidifies.

Generally speaking, the flat top surface of the die, hereinafter referred to as the die tip, is about 0.005 inches to 0.015 inches high, i.e. the die tip extends above the top of the crucible by this distance. The tip itself is about 0.002 inches to 0.030 inches across with the sidewall of the die in the conventional EFG system being at a right angle to the top surface of the die.

As noted, the die tip is wetted with molten film or pool of the source material supplied to the tip by capillary flow from the crucible via the bore of the die member. The growth of the desired crystalline body (e.g., sapphire fiber) is initiated by supplying seed crystal to the molten film at the die tip. Subsequently, the seed crystal is drawn upwards away from the tip of the die. A molten film of source material remains sandwiched between the growing crystalline body and the die tip. Since liquid material is continuously replenished via the crucible and capillary-forming die, continuous crystalline bodies such as e.g., fibers, rods, ribbons and tubes may be grown from the melt. In the production of sapphire fibers, the growing fiber is pulled steadily upwards, while the bottom of the fiber grows downward at the same rate where molten sapphire is solidifying at the bottom end of the fiber product. The molten material is replenished via capillary action through the central bore of the die to the die tip where the liquid material spreads out over the top surface of the die tip. At steady-state conditions, the process may be operated continuously and very long single-crystal fibers, for example, may be grown.

While the EFG process is generally effective to produce useful fibers and related shapes such as rods, it has been found difficult to run the process at relatively fast growth rates while maintaining void-free product. Voids tend to form just under the surface of the crystalline material during the EFG growth process as the material is drawn away from the tip of the die. These voids are thought to form because the fiber growing from a conventional die tip is cooler at the outer edge of the tip than in its center. This temperature difference causes the outside of the fiber to cool below the anneal temperature first, creating a relatively unyielding shell of crystalline substance on the surface of the growing fiber. As the solid material inside the fiber subsequently cools towards the anneal temperature, it contracts but since the outside of the fiber is already essentially an unyielding shell, shrinkage of the inside material leaves tiny voids in the crystal. These voids, which form in solid solution several fiber diameters above the die tip, greatly degrade optical transmission of the resulting product.

Fast growth of void-free optical fiber has been demonstrated on an experimental basis (Pollock, J. T. A., *Filamentary sapphire, Part 3: the growth of void-free sapphire filaments at rates up to 3.0 cm/min*, Journal of Materials Science 7: 787-792 (1972)). This method relied on heat shields placed with extreme precision. However, while void formation seems to have been reduced using this method, it has been found extremely difficult to reproduce the results and the method is not appropriate for commercial production.

Sapphire fiber for optical applications is conventionally grown very slowly to prevent void formation. Rates for commercial growth are reportedly at speeds of about 3 in./hr to about 6 in./hr. This slow speed reduces the heat of fusion rejected from the freezing sapphire and allows the temperature across the die tip to remain sufficiently uniform so that shrinkage voids are not created inside the growing sapphire fiber. However, due to the slow speed at which the sapphire fiber must be grown if voids are to be avoided, output is limited and the resulting fibers are, as a consequence, expensive. There is, therefore, a real need to provide methods and apparatus for growing void-free sapphire fibers and the like faster and at reduced cost. Accordingly, the principal object of the invention is to provide such a process and apparatus for growing void-tree sapphire fibers or the equivalent at a commercially desirable rate of growth, e.g. ten or more times faster than previously possible using the EFG process. Other objects will also be apparent from the following detailed description of the invention.

SUMMARY OF THE INVENTION

Broadly stated, the objects of the invention are realized, according to one aspect of the invention, by modifying the shape of the die tip used in the EFG process. More specifically, the invention is based on the finding that voids can be avoided, or at least substantially minimized, by using a die tip wherein the sidewall of the tip is sloped away from its top surface at an angle of from 5 to 40° from the vertical, such a die tip being hereinafter referred to, for convenience, as a "sloped die tip". This is substantively different from conventional EFG systems where the sidewall of the tip is at a right angle to the top surface of the die tip where the molten film of material collects. See, for example, U.S. Pat. No. 3,591,348.

The reasons why the sloped disposition of the die tip sidewall, according to the invention, functions to enable relatively fast fiber growth while avoiding or minimizing voids in the resulting fibers, are not fully understood. It appears that the sloped disposition somehow functions to better balance the heat content of the molten film across the tip end from the outer edge of the die tip to its center. More specifically, it appears that the sloped tip wall conducts heat up the tip, keeping the outside or outer edge of the top surface as warm as the inner region or center. This appears to allow the whole face of the growing fiber at the die tip to solidify or freeze essentially simultaneously and uniformly, thus preventing shrinkage voids from forming, even at high growth speeds. Whatever the explanation may be, it has been found that the indicated modification of the die configuration enables the production of void-free sapphire fibers and rods at a faster rate, e.g. 10 or more times faster, than previously possible using the conventional EFG process.

Advantageously the sidewall of the sloped die tip is at an angle to the vertical of about 5° to about 35°, preferably between 10° to 30°, the angle selected in any specific situation depending on various other factors, including, for example, the overall tip size and the size of the die bore thereon. The slope need not be maintained throughout the height of the tip, i.e. the slope is necessary only for, as an example, the top 35-50% of the sidewall, with the rest of the sidewall disposed vertically, if desired, with respect to the top. However, it may be more convenient to maintain the selected angle or slope throughout the height of the tip.

BRIEF DESCRIPTION OF THE DRAWINGS

The invention is more fully described by reference to the following detailed description and the accompanying drawings wherein.

DETAILED DESCRIPTION OF THE INVENTION

Figure 1:
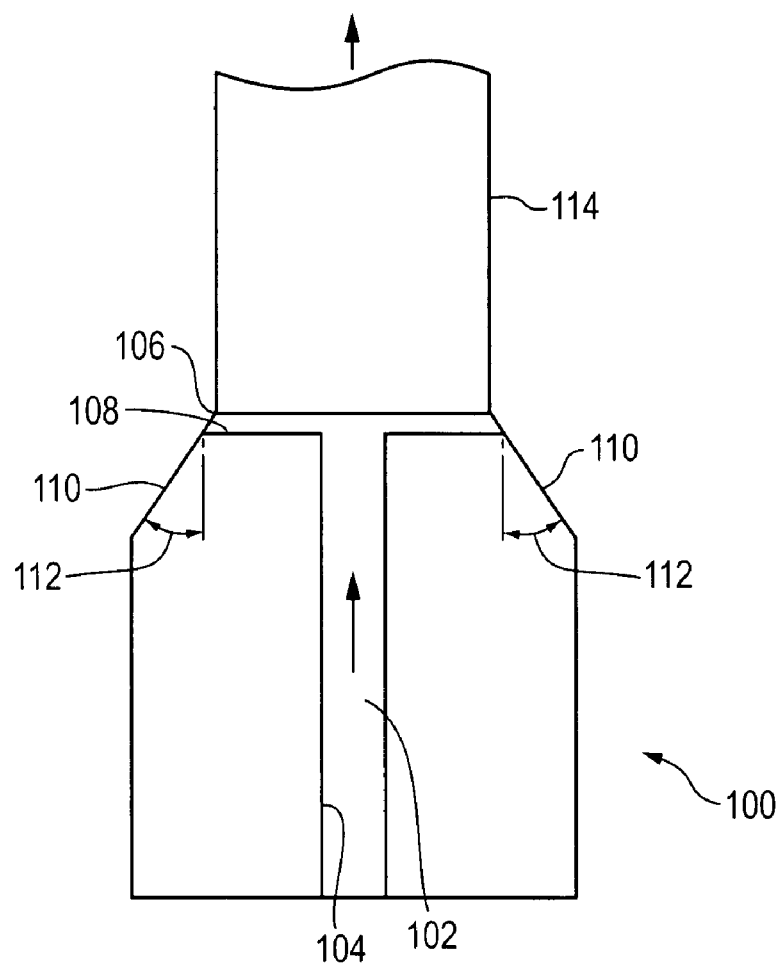
FIG. 1 is a side view in section showing a sloped die tip according to the invention.

Referring more specifically to the drawings, FIG. 1 exemplifies a sloped die tip representative of the invention and its manner of use in an otherwise conventional EFG system. The drawing only shows the tip portion of the capillary-forming die 100 as it exits from the top of the crucible (not shown) where, for example, $\alpha\text{-Al}_2\text{O}_3$ is melted for the purpose of forming sapphire fibers. The molten sapphire material 102 flows by capillary action upwardly as shown through the bore 104 of the die tip 100. The molten sapphire exits from the top of bore 104 to form a molten film 106 on the flat top surface 108 of the die 100.

Contrary to conventional EFG systems, where the sidewall of the tip would be vertical, the sidewall 110 of the die tip of FIG. 1 slopes outwardly away from the top surface 108 of the tip at an angle represented by the numeral 112.

The growing void-free sapphire fiber 114 is pulled away from the molten film 106 which is constantly replenished with molten material 102 via bore 104. The molten film 106 attaches to the preceding solidified sapphire 114 as it is pulled away from the die.

The angle 112 of the sidewall adjacent the flat top 108 of the tip may be varied but should be less than 40° from vertical. In a preferred embodiment, the angle of the outside wall of the die tip may be between about 10° and about 30° to the vertical with a variation of ±5° depending upon such factors as the diameter of the tip, i.e. the diameter of the top flat surface 108 of the tip. As an example, a tip with an outer diameter of about 0.024 in. desirably has the sidewall at an angle of about 30° from vertical. In an alternate embodiment, a tip with an outer diameter of about 0.006 in. may have an angle of about 10° from vertical. In yet another embodiment, the angle of the wall may be as low as about 5° from vertical. Generally speaking, the angle of the sidewall will preferably increase over the range indicated as the outer diameter of the tip increases. Usually the diameter of the flat top surface 108 of the die tip, or its largest dimension if the surface is not circular, will vary from about 0.002 inches to 0.030 inches with the diameter of bore 104 being about one quarter to one third the size of the diameter or largest dimension of the flat top surface 108 of the tip.

The optimal angle for the sloped die tip of the invention depends, as noted above, on a variety of factors, including, in particular, the thermal field (e.g., insulation and heat shields) surrounding the tip. In any case, if the angle is too large, the diameter of the fiber may be difficult to control. On the other hand, if the angle is too small, then voids will form in the fiber as in the conventional EFG process where the sidewall is at right angles to the tip surface. With the sidewall of the tip at the correct angle, i.e. less than 40° down to about 10° to the vertical, however, fast void-free uniform fiber growth is easily achieved.

As noted, the invention enables substantially increased growth rates to obtain void-free sapphire fibers by using the sloped die tip. The optimum growth rate in any particular situation will depend on other operating variables, e.g. the diameter of the die tip and the diameter of the die bore. However, typically, growth rates in the order of 1500 mm/hr or higher can be used to grow void-free sapphire fiber about 0.018 in. (450 µm) in diameter. Conventional EFG procedures, i.e. without the sloped tip, generally give voids at fiber growth rates above about 150 mm/hr. In general, use of the present invention has been found to enable approximately ten times faster growth rate to obtain void-free crystalline material than hitherto possible.

The bore in the top of the die tip, as indicated, should be between about one fourth and about one third, preferably closer to one fourth, of the outer diameter or larger dimension of the die tip but not larger than 0.030 inches. If the hole is much larger, void-free fiber growth may be more difficult to obtain. On the other hand, a smaller hole diameter may limit growth speed by unduly restricting the high velocity flow of the viscous liquid sapphire. In one preferred embodiment of the invention, the outer diameter of the tip is 0.018 in. and the hole diameter is 0.005 in. However, it will be appreciated from the foregoing that these dimensions can be varied and will be appropriately selected by those skilled in the art.

The sloped die tip and the die overall may be made from tungsten or any other material suitable for use with molten sapphire, e.g., molybdenum or iridium. Advantageously, the die tip is an integral part of the capillary-forming die itself. However, if desired, a separate die tip may be placed over the end of the die provided such die tip includes the required opening for the flow of molten sapphire and provides a flat surface surrounding the opening to support the required pool of molten material.

Figure 2:
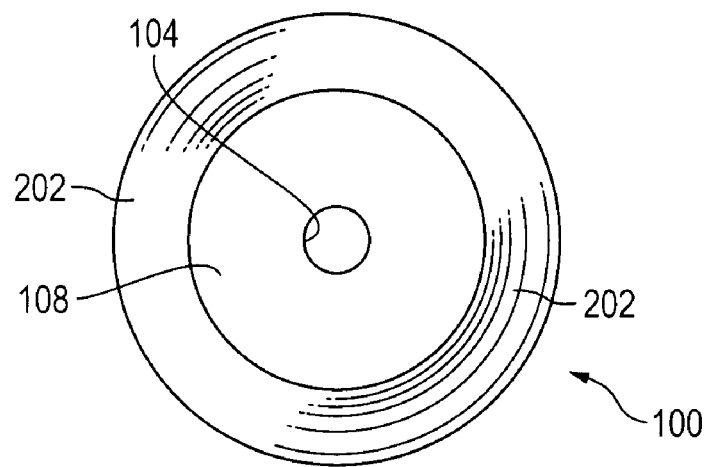
FIG. 2 is a top plan view of a die tip according to the invention, the slope of the sidewall being shaded.

FIG. 2 is a plan view showing the top surface 108 of a die 100 according to the invention with bore 104 and shows, by the shadowed portion 202, how the sidewall of the die slopes outwardly away from the top surface 108. The angular disposition of the sidewall results in the temperature being relatively uniform across the entire top surface of the die tip, thus allowing all parts of the growing fiber to cool uniformly and thereby prevent void formation. As noted earlier, without sloping the sidewall of the die tip, the outer perimeter of the tip would be cooler relative to the temperature at the discharge opening of the feed bore 104 with the result that the outer perimeter of the melt would cool and solidify first resulting in the formation of voids as the fiber is pulled away.

Figure 3A:
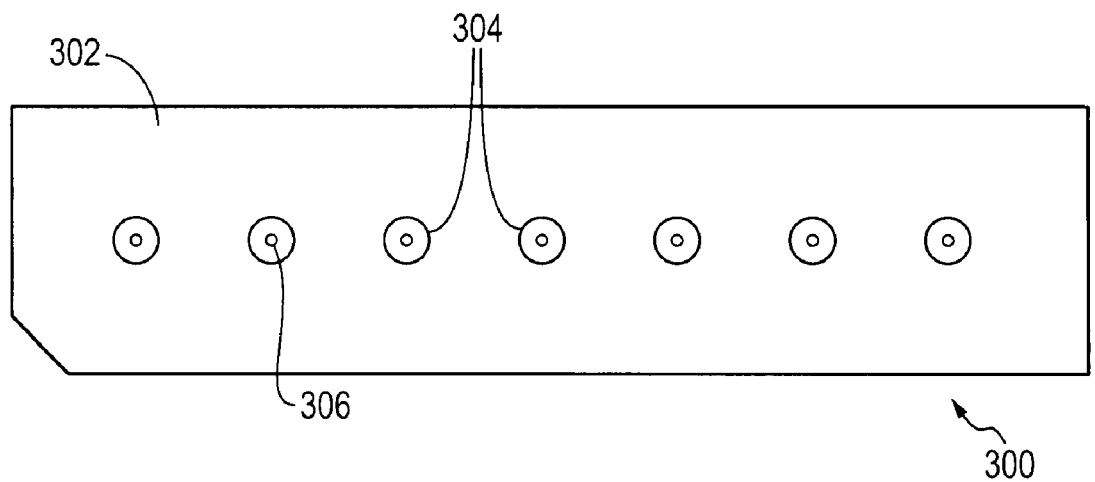
FIGS. 3A-3C illustrate a die tip array and features thereof using a plurality of sloped die tips according to the invention.
Figure 3B:
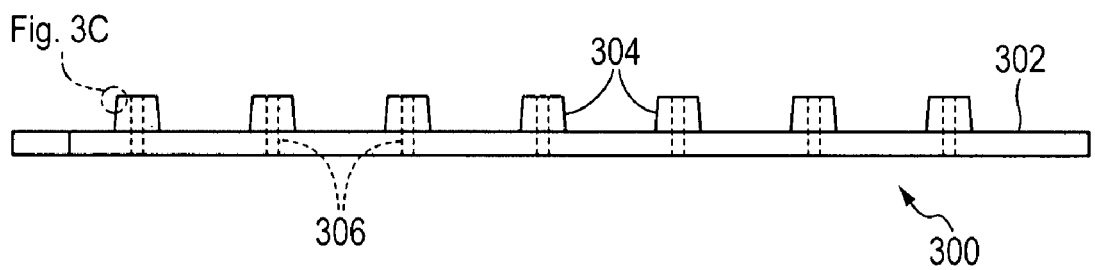

The method of the invention may be practiced with an apparatus comprising a single sloped die tip or with an array of such tips. FIGS. 3A and 3B show a die tip array 300 suitable for use in the practice of the invention. The sidewall of each of the die tips 304 has the sloped disposition required for the invention. The sidewall angle at the top of the die is not shown in FIGS. 3A and 3B. However, it will be recognized that it is intended that each of the tips 304 includes the outwardly sloped angle feature of the invention. This die tip array may be used to simultaneously grow a multiplicity of void-free sapphire fibers. Preferably a mesa is positioned beneath the array to provide a common source of melt to the several die tips. A die with such a mesa is exemplified in FIGS. 5A-5C.

The array 300 of FIGS. 3A and 3B comprises a substrate 302 and two or more sloped die tips 304 each with a feeder bore 306. Substrate 302 may be made from tungsten or any other suitable material. The sloped die tips 304 may be machined into the substrate. Preferably, the spacing between two or more sloped die tips 304 in the array is at least two tip diameters or greater.

A sloped-tip die array according to the instant invention, may vary in size and shape. The one illustrated in FIG. 3A is rectangular but any convenient shape may be used. The array may include any number of sloped die tips according to the invention, seven being shown in FIG. 3A. The spacing, size and number of the tips in the array can be widely varied as will be understood in the art provided the sloped sidewall feature is maintained.

Figure 3C:
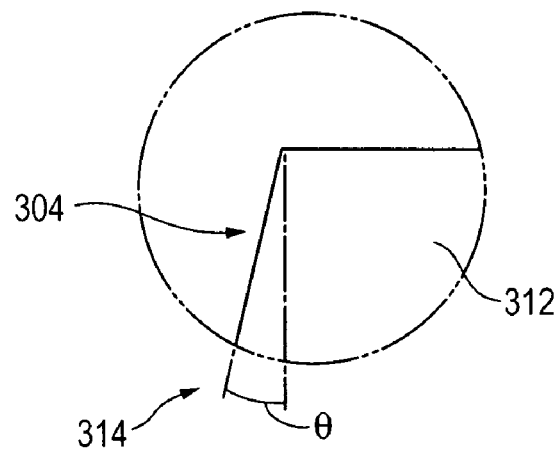

FIG. 3C is presented to show a close-up view of the outside corner of a sloped die tip 304 as used in the array of FIGS. 3A and 3B. The outside of the sloped tip is slightly tapered according to the invention so that the sloped die tip 312 has an angle 314 which, in the embodiment shown, may be about 20°.

Figure 4:
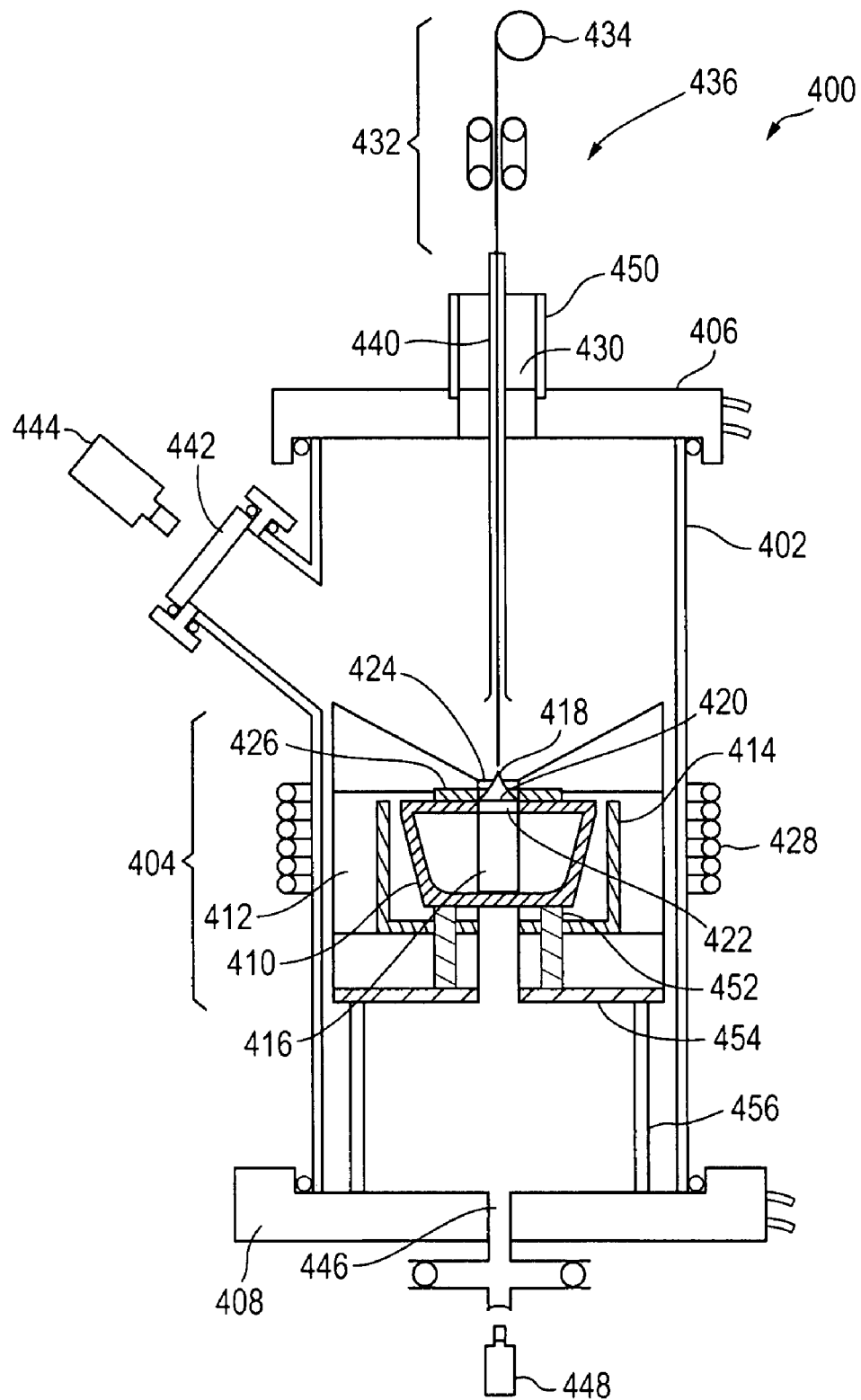
FIG. 4 is a schematic illustrating the EFG growth system with which the sloped die tips of the invention may be used.

FIG. 4 shows an EFG apparatus suitable for use with the present invention. As shown, the EFG apparatus 400 comprises a vessel 402 having a hot zone 404 where the crystalline material is liquified. The vessel 402 has a top 406 and a base plate 408, both of which are cooled by water or the equivalent. The hot zone 404 contains a crucible 410, insulation 412, and a heater 414. The heater 414 may surround the crucible 410 without directly contacting the crucible. Surrounding the heater is insulation 412. Inside the crucible 410, a die 416 is located such that the die rests on the bottom of crucible 410. Die tip 418 rests on top of a mesa 420 which in turn is positioned above crucible lid 422 and connected to the die 416. The die tip 418 is in line with an opening 424 in crucible lid 422. Surrounding the die tip 418 is at least one insulating shield 426. The insulation is supported above the lid in such a way that the flow of gas inside the vessel 402 is not interfered with. Vessel 402 has at least one induction coil 428 mounted exterior to the vessel in a location corresponding to that of the hot zone 404. Above crucible 410 additional insulation is positioned.

Vessel top 406 has at least one opening 430 through which at least one guide tube 440 may be inserted through the openings inline with the die tip. The guide tube directs the growing crystalline material (e.g. sapphire) to the pulling apparatus. The pulling apparatus 432 withdraws the growing crystalline material. This apparatus may consist of a spooler 434, belt puller 436, and motor 438 (not shown). When the EFG apparatus is used for growing the crystalline material, at least one guide tube 440 may be inserted through the openings inline with the die tip. The guide tube directs the growing crystalline material (e.g., sapphire) to the pulling apparatus.

Optionally, the vessel 402 has two or more extensions, which hold a viewing window 442. The viewing window 442 may be located above the reaction vessel to view the tip. When the viewing window 442 is located above the vessel the insulation 412 is slanted so to allow a clear view of the die tip 418. This optional viewing window may be utilized with an instrument 444, such as e.g., CCTV telescope or a camera. A CCTV telescope or camera allows continual monitoring of the fiber. The base plate 408 may also optionally have a viewing window 442 for an optical pyrometer.

Vessel 402 surrounds the hot zone of the EFG apparatus. The vessel may be cylindrical and made from quartz or equivalent material. In one embodiment, the vessel has about ⅛ inch clearance from the insulation, and is about 8 inches high. The ends of vessel 402 are sealed. The vessel isolates the hot zone from the atmosphere, and contains the flowing inert gas atmosphere. While argon is the preferred, other inert gases may be used.

The walls of the vessel 402 are not cooled during operation. Only the top and bottom are cooled. Conventionally, chambers are double-walled (quartz or stainless steel) with cooling water flowing between the walls.

Advantageously, all metal parts of the hot zone are tungsten, which has better high-temperature strength than, for example, molybdenum, although other materials, including molybdenum may be used. An advantage in using tungsten apart from its high-temperature strength is that it also has a lower vapor pressure, which reduces deposits on the growing fiber. It can also withstand high levels of CO or carbon vapor, which tend to damage molybdenum. Additionally, the solubility of tungsten in liquid sapphire is acceptably low.

The vessel also includes valve means for introducing an inert gas or creating a vacuum as and when desired.

The base plate 408 supports vessel 402 and has flow penetrations for the inert gas (e.g., argon) and vacuum. The base plate may have internal channels through which a cooling liquid (such as e.g., water) can flow. An O-ring on the base plate 408 seals the bottom of vessel 402. To protect the O-ring sealing the bottom of the vessel from overheating, a cooling liquid (such as water) flows through internal channels in the base plate.

The base plate and the pulling apparatus are supported by a rigid (e.g., aluminum) structural framework. The framework rests on tuned dampers to minimize motion and vibration.

The base plate 408 may also have a central hole 446 in the bottom. The central hole, which may be, for example, about ¼ in. in diameter, allows an optional optical pyrometer 448 to measure the temperature of the bottom of the crucible. The hole penetrates the insulation, the heater, and the structural elements. Typically, the hole is sealed by a quartz window.

In addition, the base plate 408 may have a means for introducing a vacuum and a means such as e.g., a valve for introducing an inert gas.

Top 406 covers the vessel. The vessel top may have internal channels through which a cooling liquid (such as e.g., water) can flow. The vessel top 406 may utilize an O-ring at the interface between the vessel and the top. To protect the O-ring sealing the top of the vessel from overheating, the top is also cooled by liquid, such as e.g., water flowing through internal channels.

The vessel top has a central hole, which may be plugged for pulling a vacuum. During operation, the plug is removed and replaced by a chimney 450, which prevents backflow into the vessel. In one embodiment, the chimney 450 is a short glass chimney. The growing fibers exit the vessel through this central hole.

Guide tube 440 may be inserted through the central hole in line with the die tip to direct the growing crystalline material to the pulling apparatus. The growing fiber travels up guide tube 440. In another embodiment of the invention, the lower end of the guide tube is positioned about 1 in. to 3 in. above the die tip. The guide tube may be held by an adjustable holder, which rests on an X-Y stage, which in turn rests on the vessel top. Multiple guide tubes may be used when multiple fibers are grown simultaneously.

The crucible 410 may be any heat-resistant container in which crystalline material such as sapphire, can be heated to a sufficiently high temperature to render the same flowable or molten. Typically, the crucible is made of ceramic or other inert metal. The lid of the crucible has at least one opening for passage of the die through it to provide the die tip.

The crucible may rest on metal pins 452. These pins may be supported by a graphite plate 454, which rests on a pedestal 456, which in turn is supported by the water-cooled base plate. The pedestal may be made from mullite or another ceramic. For sapphire, the crucible is preferably made from tungsten, molybdenum, or iridium. For growing other crystals, the crucible and other metal parts can be other materials if desired. For example, for silicon growth, one may use a graphite crucible, die, etc while platinum may be used for growing lithium niobate.

Heater 414 surrounds the crucible 410, i.e., the heater is around and under the crucible. Heater 414 extends as high as the top of the lid. In one embodiment of the invention, heater 414 is about ⅟₁₆ in. thick. It may be spaced about ⅛ in. from the bottom of the crucible and from the edge of the lid. The heater makes heating more uniform by reducing hot spots on the crucible wall, and protects the insulation (e.g., fibrous graphite) from erosion. Preferably, the heater does not directly contact that crucible. Also preferably, the heater 414 is made from graphite.

As noted earlier, the die tip 418 may be a single tip or an array. The die tip 418 rests on mesa 420 on top of the die 416. The die 416 may be cylindrical, and has a feed slot up the middle. The top of the feed slot is under the die tip, and feeds liquid sapphire to the tip. The liquid crystalline material, such as e.g., sapphire, contained in the crucible passes through the feed slot via e.g., capillary action, and then through the die tip. The opening 424 in crucible lid 422 may accommodate the die body with the die tip protruding from the top of the die. Alternatively, the holes are aligned with the die tip such that the liquid crystalline material can pass through the tip.

Insulation 412 surrounds the heater 414. Preferably, insulation 412 is a fibrous graphite insulation. In one embodiment of the invention, the insulation may have a thickness of about ½ in. thick around and under the heater.

Around the die tip 418 is at least one shield 426 (e.g., two shields). The shield is positioned laterally by a projection from the crucible lid. The shield reduces heat loss from the exposed top of the die.

At least one external induction coil 428 is mounted on the exterior of the vessel in a location corresponding to that of the hot zone 404. The external coil may be a water-cooled induction heating coil.

The pulling apparatus is positioned above the growing fibers where it functions to pull the fibers up through e.g., a pair of endless belts to a collection point.

As will be evident, an EFG apparatus according to the invention may be used as follows to prepare sapphire fibers: The starting crystalline material, e.g. $\alpha Al_2O_3$ is placed in the crucible, and the inert atmosphere is established. The crystalline material inside the crucible is heated to the point where it is molten. Typically, where sapphire is involved, the crucible is heated to slightly above 2050° C. The molten material moves from the crucible through the die and die tip by capillary action. At the die tip, the crystalline material flows into the top surface of the top and is pulled away as fiber as earlier described.

The system is assembled as shown in FIG. 4 and power is applied to the induction-heating coil. The high-purity sapphire pieces, i.e., $\alpha$-aluminum oxide ($\alpha$-$Al_2O_3$) are allowed to melt to create the "starting melt." Once the starting melt is created, growth of the sapphire fiber can proceed. For this purpose, the seed fiber is lowered slowly onto the tip, where it melts to seed the melt. After waiting for the temperatures to equilibrate, the seed fiber is drawn upward with growth of fibers carried out at high speed (e.g. at about 1500 mm/hr).

After the fiber has grown beyond the puller, the speed is lowered to 800-1500 mm/hr, depending on the diameter of the fiber and the degree of clarity desired. Higher speeds give void-free fiber but can increase solid-solution scattering. Large diameter (e.g. 0.024 inch) fiber with near-theoretical clarity and excellent smoothness can be grown at rate of about 800 mm/hr.

If necessary, the temperature also is adjusted. It is well within skill of the art to adjust the temperature appropriately since experience shows the best temperature for maximum clarity for a particular speed and fiber diameter.

Once the desired growth conditions are met, growth is continued until the crucible is empty. Slight increases to the power are typically required every hour or so during a run.

Figure 5B:
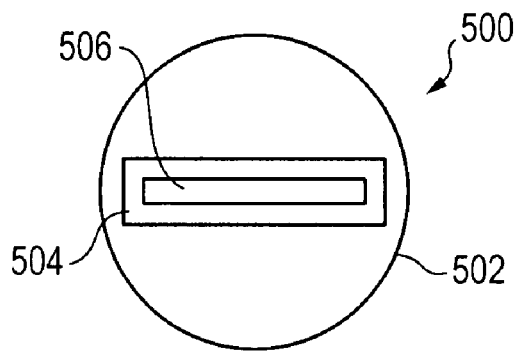
FIGS. 5A through 5C illustrate a variation in the type of die structure, particularly for use with an array of die tips as shown in FIGS. 3A and 3B.
Figure 5A:
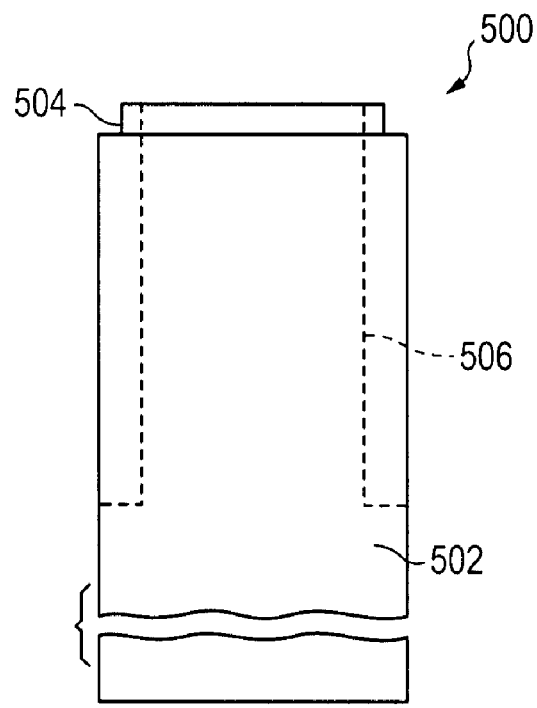
Figure 5C:
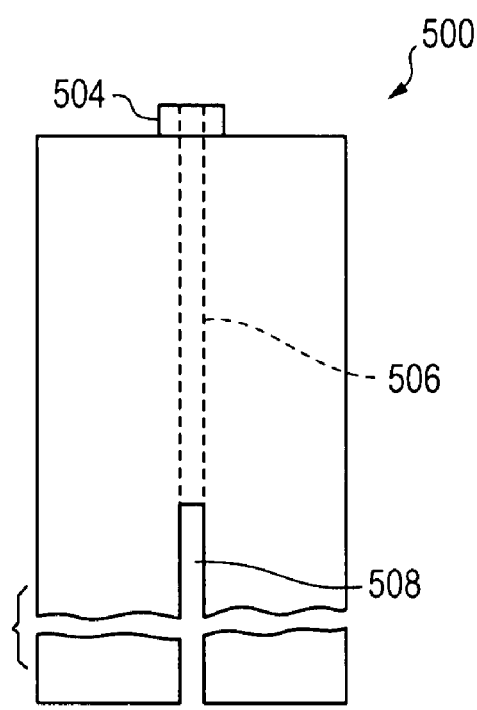

FIGS. 5A-5C illustrate one type of die which is particularly useful with a die tip array as shown in FIGS. 3A and 3B. FIG. 5A is a side view of the die while FIG. 5B is a top view. FIG. 5C is a side view of the die taken at 90° from the view of FIG. 5A. In the embodiment shown in FIGS. 5A-5C, the die 500 comprises the body portion 502 which carries a slotted mesa 504, the slot 506 extending through the length of the die so that, when the die is inserted into the crucible (not shown) and the latter is heated, molten sapphire is received into the slot 508 and flows by capillary action upwardly through the die via slot 506 into the mesa 504 which then delivers the molten sapphire to an array (not shown) of sloped die tips as in FIGS. 3A and 3B which rests on top of mesa 504. The slot 506 is shaped to allow capillary action to transport the molten crystalline material up the feed slot through the mesa and the die tip(s) thereon. The mesa itself may have its sides sloped at an angle up to 40° to the vertical as in the case of the sloped die tips.

Figure 6A:
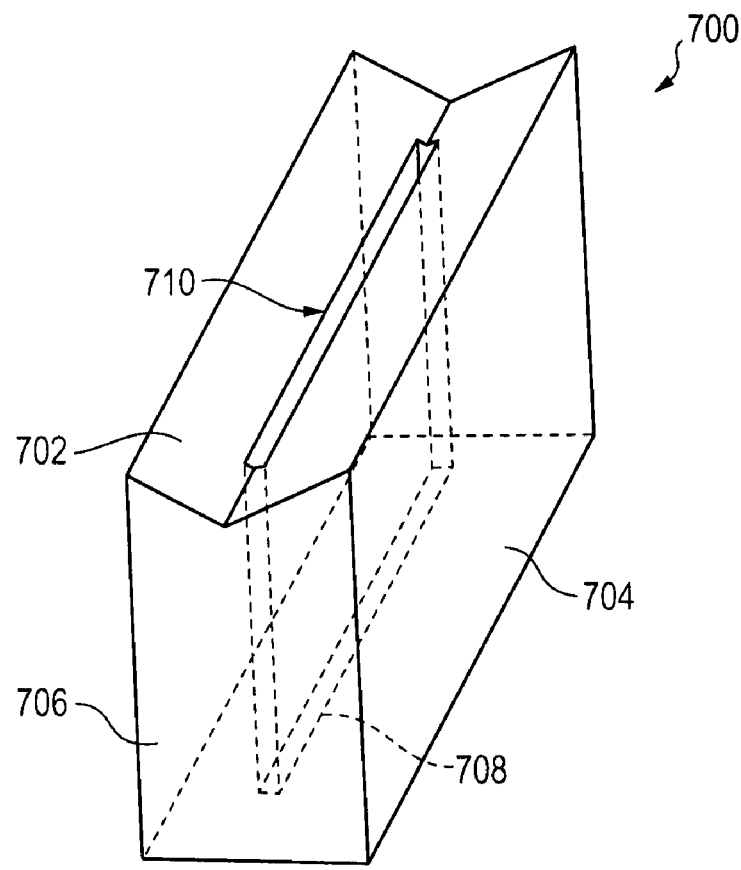
FIGS. 6A and 6B illustrate, respectively, a conventional type of die tip and a die tip according to the invention, for preparing sapphire sheet or film.

FIG. 6A is a perspective view illustrating a conventional die 700 for producing sapphire sheet. In the embodiment illustrated, the top of the die is V-shaped as shown at 702. The outside wall 704 of the die is vertical to the adjacent top edge. The same is true for outer side walls 706. Sapphire melt, fed via the channel 708, exits from the elongated slot 710 and is drawn away from the die in sheet form (not shown) essentially in the same way as sapphire fiber. The slot 710 must have a width less than 0.030", preferably 0.010", for capillary action to bring the liquid up to die top 702.

Instead of the V-shaped top shown in FIG. 6A, the top of the die may be a flat surface with an appropriately dimensioned slot extending centrally across the surface.

Figure 6B:
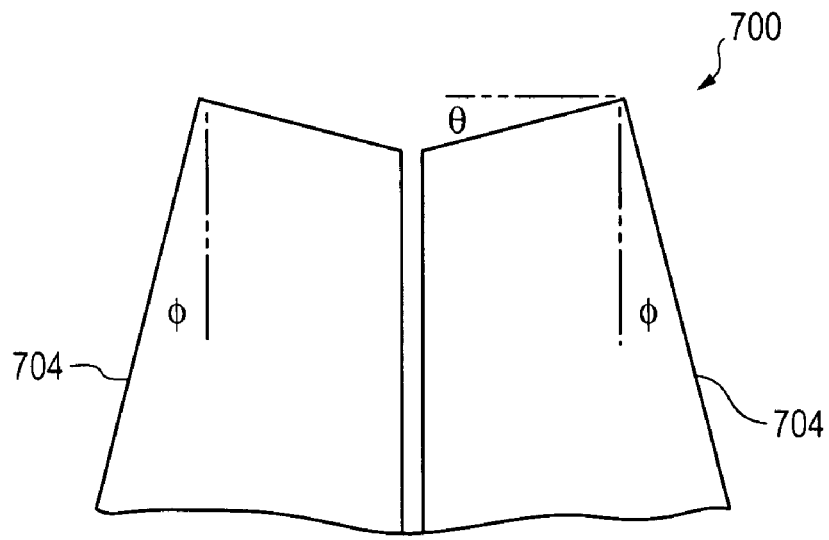

FIG. 6B is a vertical section of the top part of the V-shaped die of FIG. 6A modified according to the invention. As shown, the outside walls 704 of the die 700 are sloped at an angle $\phi$ where these walls meet the top edge of the die. This angle may vary, as in the case of the die used to prepare sapphire fibers, from 5 to 40° to the vertical, preferably from 10 to 30°. The other side walls 706 may also be similarly inclined, if desired, although this is not necessary to obtain void-free sheet or film. It is, however, essential, according to the invention, for the outside walls of the die which extend along the length of the slot 710, to be angularly disposed to the vertical as noted above.

In addition to the angular disposition of outside sidewalls 704, it is considered important for optimum results to have the top of the die symmetrically angled to the horizontal as shown by the angle $\theta$. This angle may vary from −30° to 30°. The angles $\phi$ and $\theta$ are chosen so the temperature across the top of the die is uniform enough to allow the growth of void-free sapphire sheet. The optimal angles depend on the thermal field surrounding the die top (e.g. any insulation and heat shields). If the wall angle $\phi$ is too large and/or the top angle $\theta$ too small, the thickness of the sheet will not be controlled by the width of the die, but will be unstable and smaller. If the wall angle $\phi$ is too small and/or the top angle $\theta$ too large, the outside of the die top will be too cool, and voids will form in the products.

It appears that if the appropriate angle $\phi$ is maintained, the sloped wall of the die conducts heat up the outside of the die, keeping the outside of the top as warm as the inside region, thus avoiding or minimizing void formation in the sheet or film product. Similarly, the use of a less-sloped top, according to the invention, is believed to reduce cooling of the edge regions of the die top. This allows the whole face of the growing fiber to freeze simultaneously and uniformly, thus preventing shrinkage voids from forming even at higher speeds than are conventionally achievable. Use of the die structure of FIG. 6B also appears to improve the crystal structure of the growing sapphire sheet or film, allowing higher quality crystals product to be grown at higher speeds than have previously been achievable.

While the foregoing description refers primarily to the preparation of sapphire fibers, it will be appreciated from this description that other shapes of sapphire products, e.g. rods, sheets, tubes or film, may also be prepared using the features of the invention with appropriate adjustment as to the nature of the die tip or tips. Materials such as metals, semiconductors and other oxides may also be used in lieu of sapphire (a-alumina). For example, the invention may be used to grow crystalline bodies from such materials as spinel, crysoberyl, barium titanate, lithium niobate, yttrium, vanadate, aluminum garnet, and silicon. It will also be appreciated that products with various types of cross-sections, i.e. circular or non-circular cross section, are contemplated. Other variations will also be evident to one skilled in the art.

As the present invention may be embodied in several forms without departing from the spirit or essential characteristics thereof, it will be understood that the invention is not limited by the details of the foregoing description, unless otherwise specified, but rather should be construed broadly within its spirit and scope as defined in the appended claims, and therefore all changes and modifications that fall within the metes and bounds of the claims. Accordingly, the invention is defined by the appended claims wherein:

The invention claimed is:

1. An Edge-defined Film-fed Growth (EFG) apparatus comprising a vessel suitable for holding a melt of crystalline ceramic material, means for heating said vessel to provide said melt, a die adapted to receive melt from said vessel, said die including a top surface, a bore extending through said die for providing melt from said vessel to said top surface, and means for pulling solidifying melt from said top surface, said die comprising a sidewall extending downwardly and outwardly from the said top surface, said sidewall being sloped at an angle of 5° to 40° from the vertical, whereby melt pulled from said surface is solidified to provide a product which is essentially free of voids, the angle of said sidewall functioning to maintain a relatively uniform temperature for the melt across the entire top surface while said melt is pulled therefrom.

2. The apparatus of claim 1 wherein the diameter or largest lateral dimension of the bore is about ¼th to about ⅓rd of the diameter or largest lateral dimension of the top surface of the die, but not larger than 0.030".

3. The apparatus of claim 2 for producing sapphire fibers wherein the top surface of the die is flat with the bore in said die providing a central opening in said surface.

4. The apparatus of claim 2 for producing sapphire sheet wherein the top surface of the die is V-shaped and includes a laterally extending slot for discharge of melt from the die, the outer sidewall of said V-shaped die being sloped outwardly at an angle of 5 to 40° to the vertical.

5. The apparatus of claim 4 wherein the V-shape of said top surface is disposed at an angle of 30° or less to the horizontal.

6. The apparatus of claim 1 which comprises an array of die tips positioned on a common support with means for supplying molten crystalline material to each of said die tips, each of said die tips having a sidewall extending outwardly at an angle of 5 to 40° to the vertical.

* * * * *